(12) United States Patent
Han (10) Patent No.: US 9,407,140 B2
(45) Date of Patent: Aug. 2, 2016

(54) VOLTAGE DETECTION METHOD AND CIRCUIT AND ASSOCIATED SWITCHING POWER SUPPLY

(71) Applicant: Silergy Semiconductor Technology (Hangzhou) LTD, Hangzhou, ZheJiang Province (CN)

(72) Inventor: Yunlong Han, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 144 days.

(21) Appl. No.: 14/490,825

(22) Filed: Sep. 19, 2014

(65) Prior Publication Data

US 2015/0084608 A1    Mar. 26, 2015

(30) Foreign Application Priority Data

Sep. 25, 2013  (CN) .......................... 2013 1 0441482

(51) Int. Cl.
*H02M 3/15*     (2006.01)
*H02M 3/335*    (2006.01)
*H02M 3/155*    (2006.01)
*G01R 19/00*    (2006.01)
*H02M 3/156*    (2006.01)
*H02M 1/00*     (2006.01)

(52) U.S. Cl.
CPC ........... *H02M 3/155* (2013.01); *G01R 19/0084* (2013.01); *H02M 3/156* (2013.01); *H02M 3/335* (2013.01); *H02M 3/33507* (2013.01); *H02M 2001/0009* (2013.01)

(58) Field of Classification Search
CPC ..... H02M 3/155; H02M 3/156; H02M 3/335; H02M 3/33507; H02M 2001/0009
See application file for complete search history.

(56) References Cited

U.S. PATENT DOCUMENTS

| 7,167,028 | B2 |   | 1/2007 | Hachiya |             |
|-----------|----|---|--------|---------|-------------|
| 7,515,441 | B2 |   | 4/2009 | Kashima |             |
| 8,476,882 | B2 | * | 7/2013 | Luo     | H02M 3/156  |
|           |    |   |        |         | 323/282     |
| 8,965,589 | B2 | * | 2/2015 | Zhao    | G05F 1/67   |
|           |    |   |        |         | 700/286     |
| 9,065,331 | B2 |   | 6/2015 | Xu      |             |
| 2012/0001603 | A1 | * | 1/2012 | Ouyang | H02M 3/1588 |
|           |    |   |        |         | 323/271     |
| 2014/0152283 | A1 |   | 6/2014 | Kuang   |             |
| 2014/0285163 | A1 | * | 9/2014 | Lin     | H02M 1/4225 |
|           |    |   |        |         | 323/205     |

* cited by examiner

*Primary Examiner* — Timothy J Dole
*Assistant Examiner* — Ishrat Jamali
(74) *Attorney, Agent, or Firm* — Michael C. Stephens, Jr.

(57) ABSTRACT

In one embodiment, a method of detecting a voltage can include: (i) generating a first current according to a first voltage and a converting resistor; (ii) charging a detection capacitor by the first current during a first time period of a switching cycle of a switching power supply; (iii) charging the detection capacitor by a second current during a second time period of the switching cycle; (iv) detecting a voltage across the detection capacitor to obtain a detection voltage at an end time of the second time period, where the first time period includes a rising portion of a current flowing through the inductor, and the second time period includes a decreasing portion of the inductor current; and (v) determining a state of a present output voltage of the switching power supply according to the detection voltage.

9 Claims, 12 Drawing Sheets

VOLTAGE DETECTION METHOD AND CIRCUIT AND ASSOCIATED SWITCHING POWER SUPPLY

RELATED APPLICATIONS

This application claims the benefit of Chinese Patent Application No. 201310441482.X, filed on Sep. 25, 2013, which is incorporated herein by reference in its entirety.

FIELD OF THE INVENTION

The present invention generally relates to power converter circuitry, and more particularly to voltage detection methods, circuits, and associated switching power supplies.

BACKGROUND

Switch mode power supplies can efficiently convert electrical power from a source to a load, or to several different loads, with each corresponding to a different output. The main transistor of a switching-mode supply can switch between on and off states at a given operating frequency, and voltage regulation can be achieved by varying the ratio of the on-to-off time of the main transistor. Switch mode power supplies may have relatively high power conversion efficiency, as compared to other types of power converters. Switch mode power supplies may also be substantially smaller and lighter than a linear supply due to the smaller transformer size and weight.

SUMMARY

In one embodiment, a method of detecting a voltage can include: (i) generating a first current according to a first voltage and a converting resistor; (ii) charging a detection capacitor by the first current during a first time period of a switching cycle of a switching power supply, where the first voltage includes an excitation voltage on an inductor of the switching power supply during the first time period; (iii) charging the detection capacitor by a second current during a second time period of the switching cycle, where the first and second currents flow in opposite directions; (iv) detecting a voltage across the detection capacitor to obtain a detection voltage at an end time of the second time period, where the first time period includes a rising portion of a current flowing through the inductor, and the second time period includes a decreasing portion of the inductor current; and (v) determining a state of a present output voltage of the switching power supply according to the detection voltage, where the converting resistor includes a proportion of a predetermined output voltage of the switching power supply and the second current.

In one embodiment, a voltage detection circuit can include: (i) a first current generating circuit configured to generate a first current according to a first voltage and a converting resistor, where the first voltage includes an excitation voltage on an inductor of a switching power supply during a first time period of a switching cycle of the switching power supply, and where the first time period includes a rising portion of a current flowing through the inductor; (ii) a second current source configured to output a second current, where the first and second currents flow in opposite directions; (iii) a first switch coupled between the first current generating circuit and a detection capacitor; (iv) a second switch coupled between the second current source and the detection capacitor, where the first switch is on and the second switch is off such that the first current charges the detection capacitor via the first switch during the first time period, and where the first switch is off and the second switch is on such that the second current discharges the detection capacitor via the second switch during a second time period of the switching cycle; and (v) where a voltage across the detection capacitor is detected to obtain a detection voltage at an end time of the second time period, the detection voltage being used to determine a state of a present output voltage of the switching power supply, where the second time period includes a decreasing portion of the inductor current, and where the converting resistor includes a proportion of a predetermined output voltage of the switching power supply and the second current.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Switching power supplies are widely used to supply voltage for electronic products by converting DC voltages to stable or adjustable DC voltages. When a switching power supply provides power to an electronic product, the electronic product may operate abnormally if a present output voltage of the switching power supply is lower than a suitable or required working voltage of the electronic product. Alternatively, the electronic product may be damaged if the present output voltage of the switching power supply is too high. Therefore, it is desirable for the present output voltage of the switching power supply to meet the required output voltage of the electronic product, where the required output voltage can be set to be the output voltage of the switching power supply.

In order to satisfy the above requirement, the present output voltage of the switching power supply may be detected. Also, a detection signal can be provided to a control terminal of the switching power supply for controlling the switching power supply. In this way, the present output voltage of the switching power supply can substantially be the predetermined output voltage in order to ensure normal operation of the electronic product.

Figure 1:
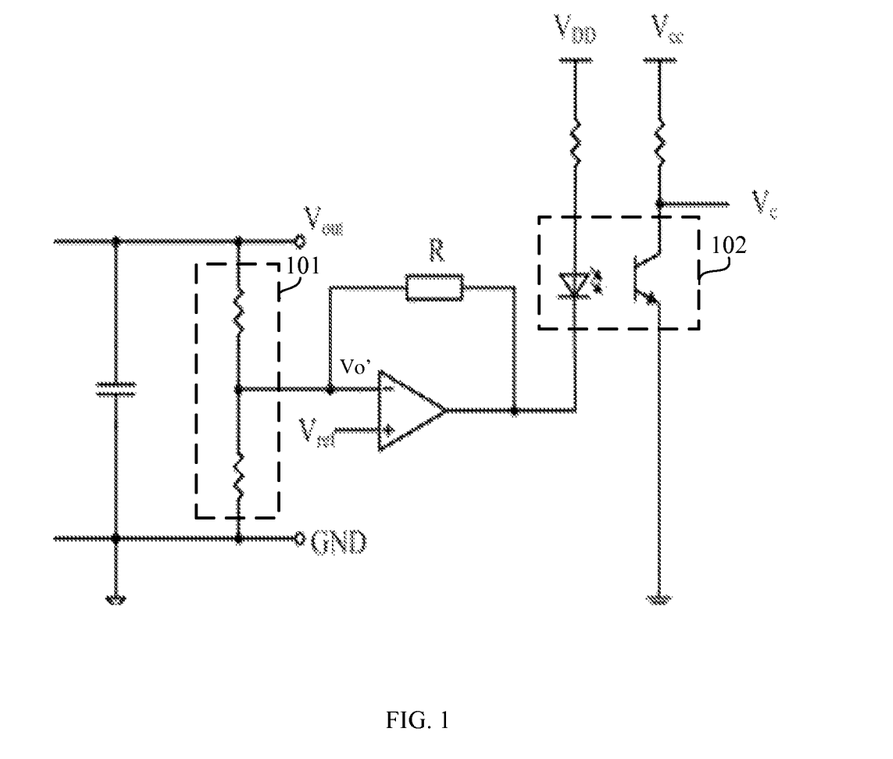
FIG. 1 is a schematic block diagram of a first example output voltage detection circuit of a switching power supply.
Figure 2:
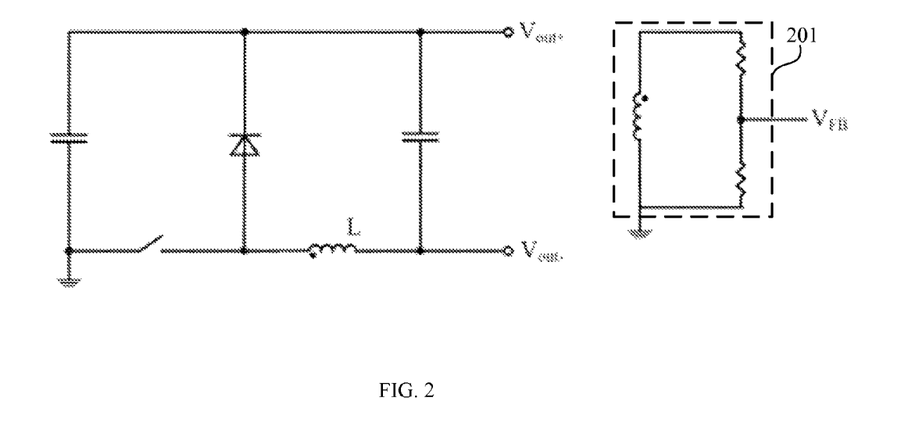
FIG. 2 is a schematic block diagram of a second example output voltage detection circuit of a switching power supply.
Figure 3:
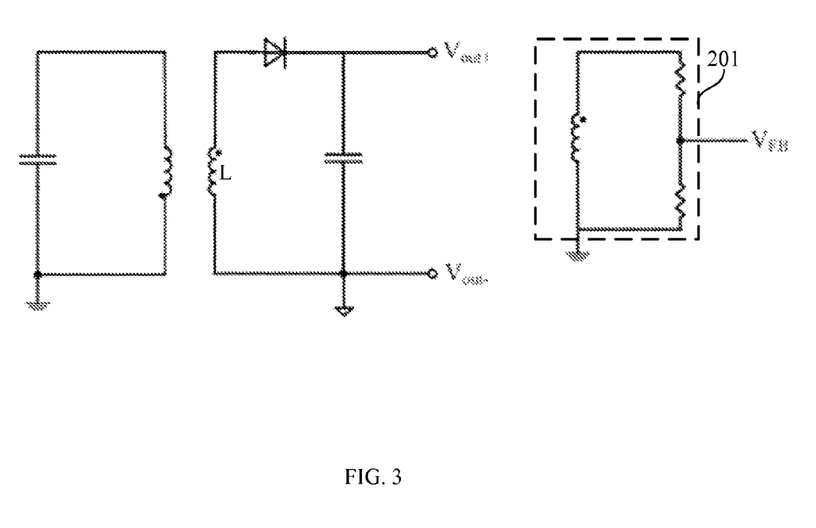
FIG. 3 is a schematic block diagram of a third example output voltage detection circuit of a switching power supply.

Referring now to FIGS. 1-3, shown are schematic block diagrams of example output voltage detection circuits of switching power supplies. In these examples, output voltage detection approaches can include obtaining sense voltage $V_o'$ from output voltage $V_{out}$ of the switching power supply by connecting resistor dividing circuit 101 at two output terminals of the switching power supply, and obtaining feedback voltage $V_c$ by optical coupler 102 for a control circuit (see, e.g., FIG. 1). Also, output voltage $V_{FB}$ can be indirectly detected by auxiliary winding 201 coupled at the output terminal of the switching power supply, and by realizing primary control by providing voltage $V_{FB}$ to a control circuit at the primary-side (see, e.g., FIGS. 2 and 3). However, in these approaches, the detection circuit can be overly complicated with relatively high product costs due to the optical coupler, and when an optical coupler is not used, product costs can be still high due to an auxiliary winding with a relatively large volume. Further, the conversion efficiency can be relatively low due to power losses on the auxiliary winding.

In one embodiment, a method of detecting a voltage can include: (i) generating a first current according to a first voltage and a converting resistor; (ii) charging a detection capacitor by the first current during a first time period of a switching cycle of a switching power supply, where the first voltage includes an excitation voltage on an inductor of the switching power supply during the first time period; (iii) charging the detection capacitor by a second current during a second time period of the switching cycle, where the first and second currents flow in opposite directions; (iv) detecting a voltage across the detection capacitor to obtain a detection voltage at an end time of the second time period, where the first time period includes a rising portion of a current flowing through the inductor, and the second time period includes a decreasing portion of the inductor current; and (v) determining a state of a present output voltage of the switching power supply according to the detection voltage, where the converting resistor includes a proportion of a predetermined output voltage of the switching power supply and the second current.

Figure 4:
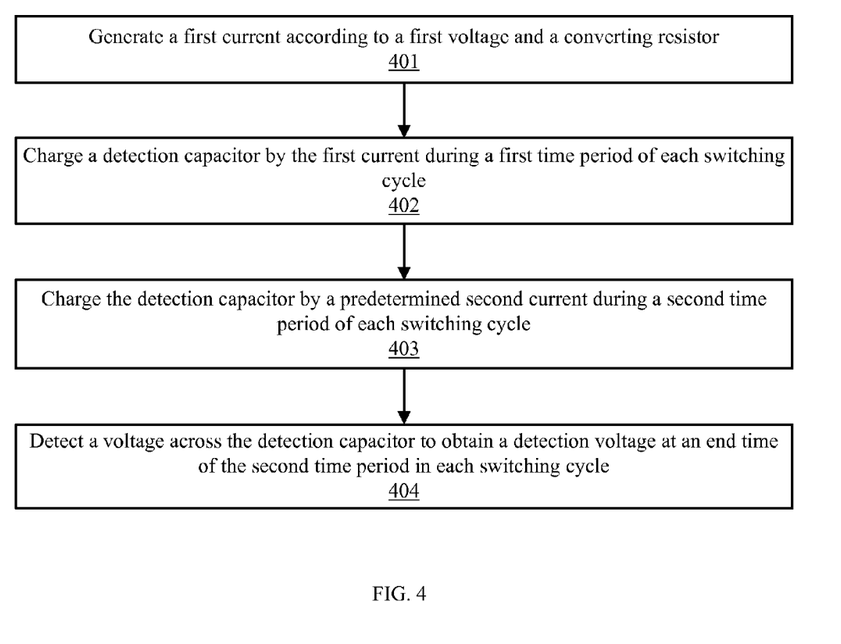
FIG. 4 is a flow diagram of a first example method of detecting a voltage, in accordance with embodiments of the present invention.

Referring now to FIG. 4, shown is a flow diagram of a first example method of detecting a voltage, in accordance with embodiments of the present invention. At 401, a first current (e.g., $I_1$) can be generate according to a first voltage (e.g., $V_L$) and a converting resistor. During operation of the switching power supply, time periods $T_1$ and $T_2$ in each switching cycle can be determined by an inductor current of the switching power supply. For example, the switching cycle can be a switching cycle of the power switch(es) in the switching power supply.

Figure 5:
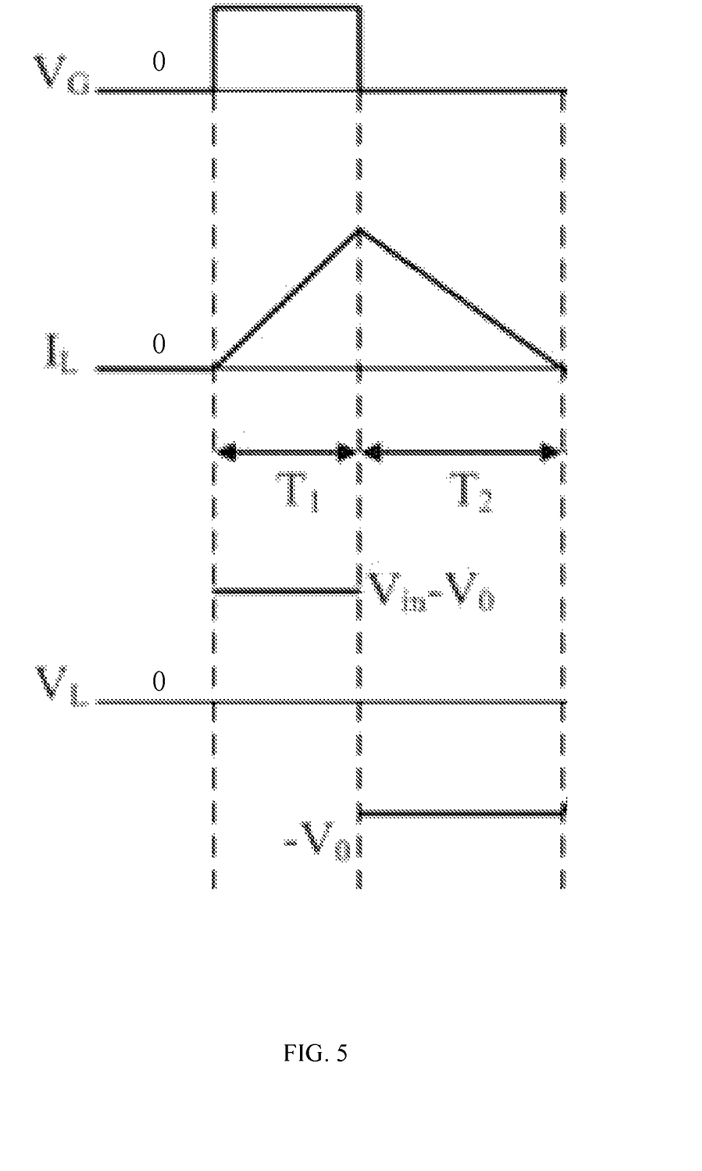
FIG. 5 is a waveform diagram of an example voltage detection, in accordance with embodiments of the present invention.

In any such switching cycle, time period $T_1$ can include a time portion when the inductor current rising, while time period $T_2$ can include a time portion when the inductor current is decreasing. FIG. 5 shows a waveform diagram of an example voltage detection, in accordance with embodiments of the present invention. In this example, each switching cycle can include time period $T_1$ in which the inductor current rises, and time period $T_2$ in which the inductor current decreases.

Figure 9:
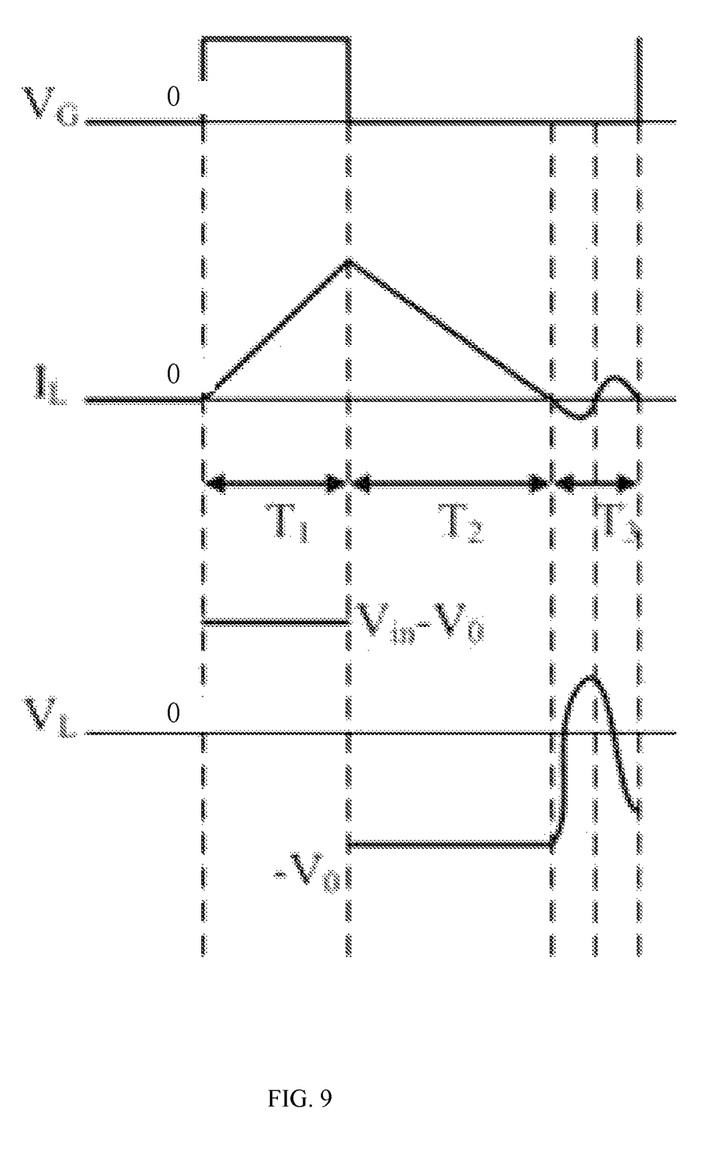
FIG. 9 is a waveform diagram of example voltage detection, in accordance with embodiments of the present invention.

Also referring to FIG. 9, in a switching power supply with a discontinuous operation mode, each switching cycle can includes three time periods: time period $T_1$ in which the inductor current rises, time period $T_2$ in which the inductor current decreases, and inductor current resonant time period $T_3$. The distribution of time period $T_1$ and time period $T_2$ in this particular example can refer to FIG. 9. Particular embodiments are suitable for a switching power supply that operates in a critical operation mode (see, e.g., FIG. 5), a discontinuous (see, e.g., FIG. 9), or in any other suitable operation modes.

Figure 12:
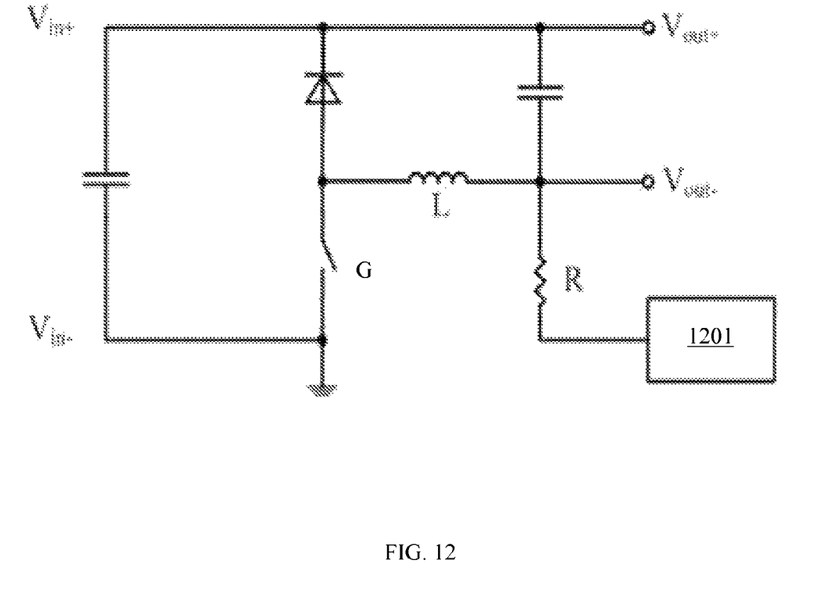
FIG. 12 is a schematic block diagram of an example buck switching power supply with a voltage detection circuit, in accordance with embodiments of the present invention.

In this particular example, during time period $T_1$, an excitation voltage on the inductor of the switching power supply can be recorded as voltage $V_L$. FIG. 12 shows a buck switching power supply, and during time period $T_1$, $V_L=V_{in}-V_o$, where $V_{in}$ can be an input voltage for the switching power supply, $V_o$ can be a present output voltage, and the excitation voltage on the inductor in time period $T_1$ can be recorded or otherwise determined as voltage $V_L$. During time period $T_1$, current $I_1$ can be generated according to voltage $V_L$ and a converting resistor. For example, the converting resistor can be equal to a proportion of a predetermined output voltage of the switching power supply (e.g., a desired output voltage of the switching power supply) and predetermined current $I_2$.

Figure 10:
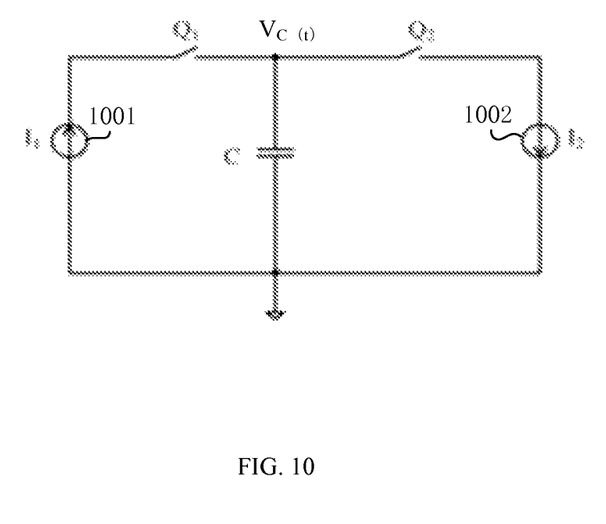
FIG. 10 is a schematic block diagram of a first example voltage detection circuit, in accordance with embodiments of the present invention.

In one example, current $I_2$ can be a substantially constant value, and may be provided by a current source (e.g., 1002 in FIG. 10). In 401 of FIG. 4, current $I_1$ can be generated according to voltage $V_L$ and a converting resistor during time period $T_1$ of the switching power supply. In the examples of FIGS. 5 and 9, waveforms of gate voltage $V_G$ of the power switch of a power stage circuit of the switching power supply, inductor current $I_L$ of the inductor, and excitation voltage $V_L$ of the inductor of the switching power supply in one switching cycle, as well as the distribution of time periods $T_1$ and $T_2$, are shown.

Referring back to FIG. 4, at 402, a detection capacitor can be charged by a first current (e.g., $I_1$) during the first time period (e.g., $T_1$) of each switching cycle. Detection capacitor C can be charged by current $I_1$ from a start time of time period $T_1$ of each switching cycle until an end time of $T_2$. At 403, the detection capacitor can be charged by a second current (e.g., $I_2$), which can be a predetermined current, during a second time period (e.g., $T_2$) of each switching cycle. After 402, from a start time of time period $T_2$ of each switching cycle to the end time, detection capacitor C can be charged by the predetermined second current. For example, a direction or polarity of the second current can be opposite to that of the first current that charges detection capacitor C at 402. Thus, the charge of detection capacitor C can be increasing during time period $T_1$, and decreasing during time period $T_2$.

At 404, a voltage across the detection capacitor can be detected to obtain a detection voltage at the end time of the second time period in each switching cycle. This detected voltage across detection capacitor C can be used to further determine a state of the present output voltage of the switching power supply. For example, it can be determined if the present output voltage of the switching power supply is greater than, less than, or equal to the predetermined output voltage. In this way, a control circuit can be used regulate the present switching power supply such that the present output voltage substantially equals the predetermined output voltage.

In order to determine the state of the present output voltage of the switching power supply according to the detection voltage, an example buck switching power supply, or power stage converter topology, can be used. According to the voltage-second balance principle, the positive voltage-second value equals the negative voltage-second value of the inductor during the steady state. Thus, the following voltage-second balance function in equation (1) during time periods $T_1$ and $T_2$ can be satisfied.

$$(V_{in}-V_o) \bullet T_1 = V_o \bullet T_2 \quad (1)$$

Dividing converting resistor R on both sides of equation (1), the voltage-second balance equation (1) can be converted to an ampere-second balance equation (2).

$$\frac{V_{in}-V_o}{R} \cdot T_1 = \frac{V_o}{R} T_2 \quad (2)$$

From equation (2), during time period $T_1$, charging detection capacitor C by current $I_1$ has a value equal to $$\frac{V_{in}-V_o}{R},$$

and during time period $T_2$, charging detection capacitor C by current $I_2$ has a value equal to $$\frac{V_o}{R}$$

and a direction opposite to current $I_1$. Thus, a voltage (e.g., $V_{c(T1+T2)}$) across detection capacitor C at the end time of time period $T_2$ according to the voltage-second balance can be as in equation (3).

$$V_{c(T1+T2)} = V_{c(0)} \quad (3)$$

For example $V_{c(0)}$ is the voltage across detection capacitor C at the start time of a switching cycle (i.e., the initial voltage of detection capacitor C). Based on the above in this particular example, charging detection capacitor C by the current $I_1$ during time period $T_1$, and charging detection capacitor C by replacing current $I_1$ with current $I_2$ of the opposite direction during time period $T_2$, the following equations (4), (5) and (6) can be obtained.

$$I_2 < \frac{V_o}{R}, V_{c(T1+T2)} > V_{co} \quad (4)$$

$$I_2 = \frac{V_o}{R}, V_{c(T1+T2)} = V_{co} \quad (5)$$

$$I_2 > \frac{V_o}{R}, V_{c(T1+T2)} < V_{co} \quad (6)$$

In this example, converting resistor R can be set as a proportion of a predetermined voltage (i.e., $V_{oset}$) and predetermined current $I_2$ of the switching power supply that can be $$R = \frac{V_{oset}}{I_2}.$$

Also, current $I_1$ can be a proportion of voltage $V_L$ and converting resistor R, that can be $$I_1 = \frac{V_{L1}}{R} = \frac{V_{L1}}{V_{oset}} \cdot I_2.$$

Thus, when $V_{c(T1+T2)} > V_{co}$, as $$I_2 = \frac{V_{oset}}{R}, \text{ so } \frac{V_{oset}}{R} < \frac{V_o}{R},$$

present output voltage $V_o$ can be detected as greater than the predetermined output voltage of the switching power supply. When $$V_{c(T1+T2)} = V_{co},$$

$$\text{as } I_2 = \frac{V_{oset}}{R}, \text{ so } \frac{V_{oset}}{R} = \frac{V_o}{R},$$

present output voltage $V_o$ can be detected as equal to the predetermined output voltage of the switching power supply. Also, when $$V_{c(T1+T2)} < V_{co},$$

$$\text{as } I_2 = \frac{V_{oset}}{R}, \text{ so } \frac{V_{oset}}{R} > \frac{V_o}{R},$$

present output voltage $V_o$ can be detected as less than the predetermined output voltage of the switching power supply.

Thus, detection capacitor C can be charged during time periods $T_1$ and $T_2$ of each switching cycle. Also, a voltage across detection capacitor C can be sampled at the end time of time period $T_2$ as detection voltage $V_{c(T1+T2)}$. The state of the present output voltage of the switching power supply can be determined according to detection voltage $V_{c(T1+T2)}$. Finally, the output voltage of the switching power supply can be adaptively regulated according to the state of the present output voltage.

Detection voltage $V_{c(T1+T2)}$ can be compared against initial voltage $V_{c(0)}$ of detection capacitor C, to determine the state of the present output voltage of the switching power supply. In one particular example, the charging for detection capacitor C can be realized by a controllable switching power supply. Also, a circuit for comparing detection voltage $V_{c(T1+T2)}$ against initial voltage $V_{o(0)}$ of detection capacitor C can include comparator and/or other suitable circuitry. In this way, voltage detection can be done without an optical coupler or an auxiliary winding, thus potentially resulting in a simplified circuit design and lower product costs, as well as improved conversion efficiency of the switching power supply.

Figure 6:
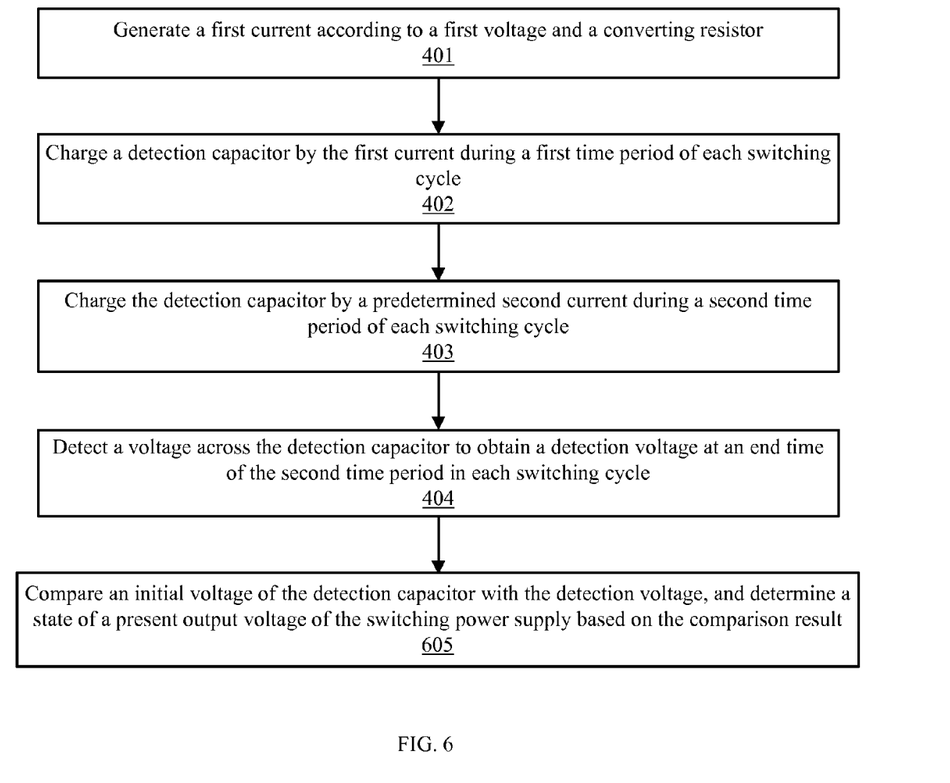
FIG. 6 is a flow diagram of a second example method of detecting a voltage, in accordance with embodiments of the present invention.

Referring now to FIG. 6, shown is a flow diagram of a second example method of detecting a voltage, in accordance with embodiments of the present invention. In this particular example, 605 can be included after 404. At 605, an initial voltage of the detection capacitor can be compared against the detection voltage, and a state (e.g., a relative state) of the present output voltage of the switching power supply can be determined according to the comparison result.

For example, when $V_{c(T1+T2)} > V_{co}$, as $$I_2 = \frac{V_{oset}}{R}, \text{ so } \frac{V_{oset}}{R} < \frac{V_o}{R},$$

the present output voltage $V_o$ can be detected as greater than the predetermined output voltage of the switching power supply. When $V_{c(T1+T2)} = V_{co}$, as $$I_2 = \frac{V_{oset}}{R}, \text{ so } \frac{V_{oset}}{R} = \frac{V_o}{R},$$

the present output voltage $V_o$ can be detected as equal to the predetermined output voltage of the switching power supply. Also, when $V_{c(T1+T2)} < V_{co}$, as $$I_2 = \frac{V_{oset}}{R}, \text{ so } \frac{V_{oset}}{R} > \frac{V_o}{R},$$

the present output voltage $V_o$ can be detected as less than the predetermined output voltage of the switching power supply. As discussed above, a comparator or other such comparison circuitry can be employed for the voltage comparison.

Figure 7:
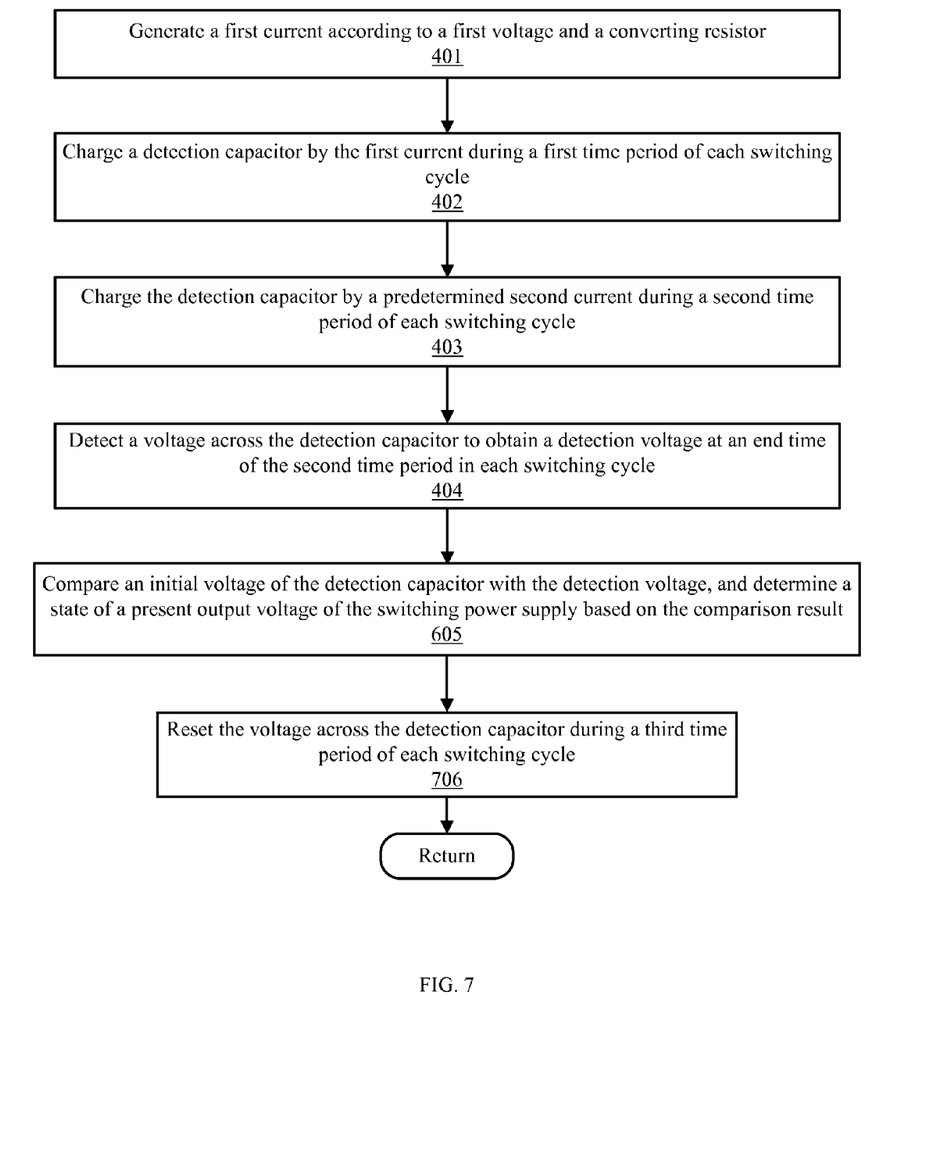
FIG. 7 is a flow diagram of a third example method of detecting a voltage, in accordance with embodiments of the present invention.

Referring now to FIG. 7, shown is a flow diagram of a third example method of detecting a voltage, in accordance with embodiments of the present invention. In this particular example, 706 can be further included after 605. At 706, the voltage across the detection capacitor can be reset during a third time period (e.g., $T_3$) of each switching cycle. For example time period $T_3$ can be a time period from the end time of time period $T_2$ to the start time of time period $T_1$ (of a next time period of a next switching cycle). As shown in FIG. 9, time period $T_3$ can include a resonant time portion in which the inductor current resonates around zero after reaching zero, and until stable at zero, in a switching cycle.

After 706, the flow can return to execute corresponding control in a next switching cycle. In this particular example, after obtaining detection voltage $V_{c(T1+T2)}$ at the end time of time period $T_2$, the terminals of detection capacitor C can be shorted to reset the voltage across detection capacitor C. In this way, initial voltage $V_{c(0)}$ of detection capacitor C can be reset at a start time of a switching cycle. For example during time period $T_3$, two terminals of detection capacitor C can effectively be shorted by turning on switch $Q_3$ (see, e.g., FIG. 11), which can be connected in parallel with detection capacitor C.

Figure 8:
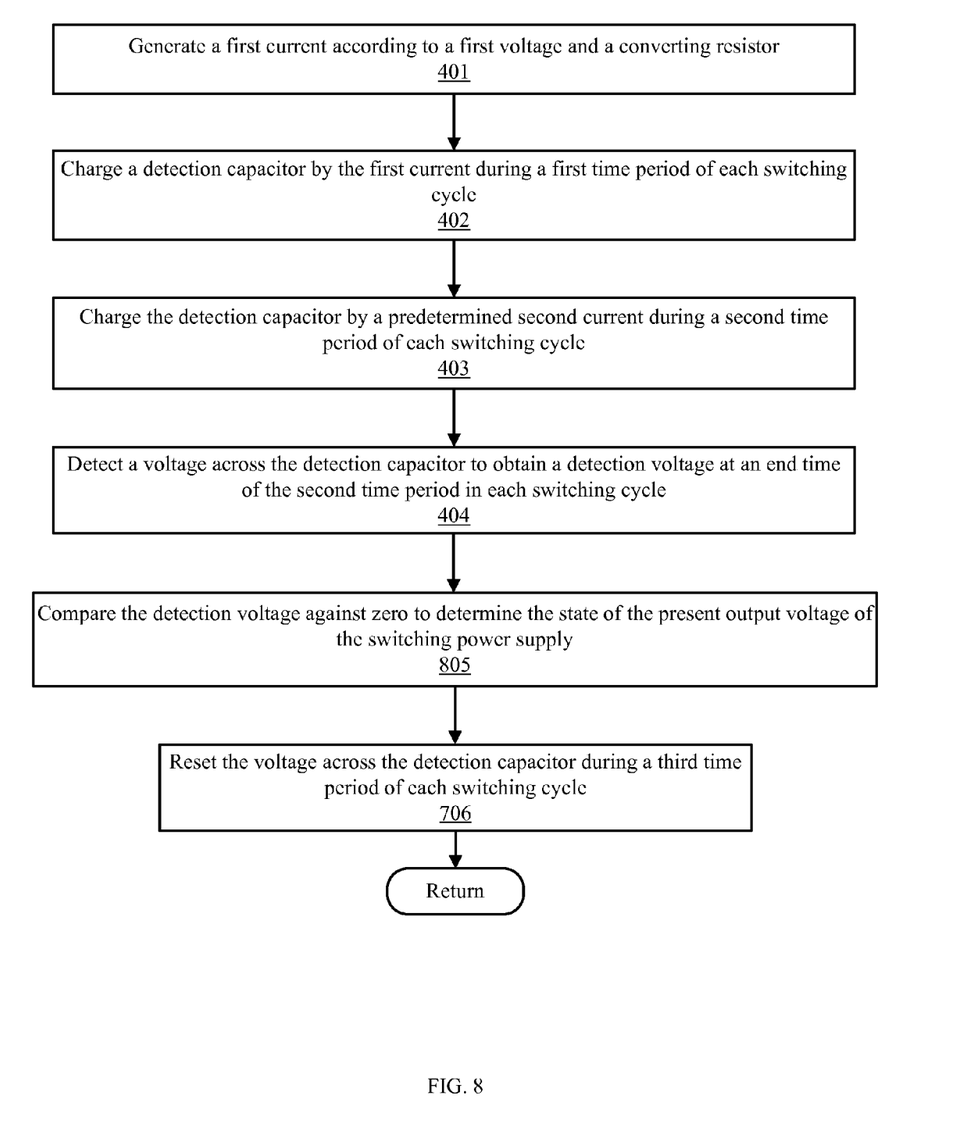
FIG. 8 is a flow diagram of a fourth example method of detecting a voltage, in accordance with embodiments of the present invention.

Referring now to FIG. 8, shown is a flow diagram of a fourth example method of detecting a voltage, in accordance with embodiments of the present invention. In this particular example, when one terminal of detection capacitor C may not be effectively grounded, the voltage across detection capacitor C can be reset to a predetermined reset voltage after 706. However, when one terminal of detection capacitor C can effectively be grounded, the voltage across detection capacitor C can be reset to zero after 706. At 805, the detection voltage can be compared against zero, to determine the state of the present output voltage of the switching power supply. After time period $T_2$ and before a next switching cycle starts, detection capacitor C can be reset such that the initial voltage of detection capacitor C in each switching cycle is zero (i.e., $V_{c(0)} = 0$), and thus the detection voltage can be compared against zero in this case.

For example, when $V_{c(T1+T2)} > V_{co}$, as $$I_2 = \frac{V_{oset}}{R}, \text{ so } \frac{V_{oset}}{R} < \frac{V_o}{R},$$

the present output voltage $V_o$ can be detected as greater than the predetermined output voltage of the switching power supply. When $V_{c(T1+T2)} = V_{co}$, as $$I_2 = \frac{V_{oset}}{R}, \text{ so } \frac{V_{oset}}{R} = \frac{V_o}{R},$$

the present output voltage $V_o$ can be detected as equal to the predetermined output voltage of the switching power supply. Also, when $V_{c(T1+T2)} < V_{co}$, as $$I_2 = \frac{V_{oset}}{R}, \text{ so } \frac{V_{oset}}{R} > \frac{V_o}{R},$$

the present output voltage $V_o$ can be detected as less than the predetermined output voltage of the switching power supply.

In this particular example, waveforms of gate voltage $V_G$ of the power switch, inductor current $I_L$ of the inductor, and excitation voltage $V_L$ of the inductor of the switching power supply in one switching cycle, as well as the distribution of time periods $T_1$, $T_2$, and $T_3$ can be as shown in FIG. 9. Therefore, as the voltage across the detection capacitor is reset during time period $T_3$, the initial voltage in any switching cycle can be the reset voltage for higher detection accuracy and stability of the switching power supply.

In one embodiment, a voltage detection circuit can include: (i) a first current generating circuit configured to generate a first current according to a first voltage and a converting resistor, where the first voltage includes an excitation voltage on an inductor of a switching power supply during a first time period of a switching cycle of the switching power supply, and where the first time period includes a rising portion of a current flowing through the inductor; (ii) a second current source configured to output a second current, where the first and second currents flow in opposite directions; (iii) a first switch coupled between the first current generating circuit and a detection capacitor; (iv) a second switch coupled between the second current source and the detection capacitor, where the first switch is on and the second switch is off such that the first current charges the detection capacitor via the first switch during the first time period, and where the first switch is off and the second switch is on such that the second current discharges the detection capacitor via the second switch during a second time period of the switching cycle; and (v) where a voltage across the detection capacitor is detected to obtain a detection voltage at an end time of the second time period, the detection voltage being used to determine a state of a present output voltage of the switching power supply, where the second time period includes a decreasing portion of the inductor current, and where the converting resistor includes a proportion of a predetermined output voltage of the switching power supply and the second current.

Referring now to FIG. 10, shown is a schematic block diagram of a first example voltage detection circuit, in accordance with embodiments of the present invention. In this particular example, the voltage detection circuit can include current generating circuit 1001, detection capacitor C, switches (e.g., transistors) $Q_1$ and $Q_2$, and current source 1002. For example, switch $Q_1$ can connect between current generating circuit 1001 and detection capacitor C, and switch $Q_2$ can connect between current source 1002 and detection capacitor C. Detection capacitor C can also have a grounded terminal in this case; however, this terminal can be connected to other nodes or voltage levels in other arrangements.

For example, current generating circuit 1001 can generate current $I_1$ according to voltage $V_L$ and the converting resistor (e.g., R in FIG. 12), and current source 1002 can provide current $I_2$. During time period $T_1$ of each switching cycle, switch $Q_2$ can be off, switch $Q_1$ can be on, and current $I_1$ can charge detection capacitor C via switch $Q_1$. During time period $T_2$ of each switching cycle, switch $Q_1$ can be off, switch $Q_2$ can be on, and current $I_2$ (with the opposite direction of current $I_1$) can discharge detection capacitor C via switch $Q_2$.

At the end time of time period $T_2$ of each switching cycle, voltage $V_{c(T1+T2)}$ across detection capacitor C can be the detection voltage. A control circuit of the switching power supply can determine the state of the output voltage according to detection voltage $V_{c(T1+T2)}$, and may adaptively regulate the output voltage of the switching power supply according to this relative state. For example, voltage $V_L$ can be the excitation voltage on the inductor of the switching power supply during time period $T_1$ of each switching cycle. Also, converting resistor R can be a proportion of predetermined output voltage $V_{oset}$ of the switching power supply and current $I_2$.

For example, time period $T_1$ can be time portion with a rising inductor current of the switching power supply in each switching cycle, and time period $T_2$ can be a time portion with a decreasing inductor current of the switching power supply in each switching cycle. Also, the switching cycle can be a switching cycle of a power switch or power stage circuit in the switching power supply. Detection capacitor C can be charged during time periods $T_1$ and $T_2$ of each switching cycle, and the voltage across detection capacitor C at the end time of time period $T_2$ can be sampled as detection voltage $V_{c(T1+T2)}$. Also, the state (e.g., relative state or voltage level) of the present output voltage of the switching power supply can be determined according to detection voltage $V_{c(T1+T2)}$. The output voltage of the switching power supply can be adaptively regulated according to the detected state of the present output voltage.

In this example, detection voltage $V_{c(T1+T2)}$ can be compared against initial voltage $V_{c(0)}$ of detection capacitor C, to determine the state of the present output voltage of the switching power supply according to the comparison result. Also, the voltage detection circuit can include a comparison circuit that compares detection voltage $V_{c(T1+T2)}$ against initial voltage $V_{c(0)}$ of detection capacitor C, and outputs a comparison result to the control circuit of the switching power supply. The control circuit of the switching power supply can determine the state of the present output voltage of the switching power supply according to the comparison result.

For example, if the detection voltage is greater than the initial voltage of detection capacitor C, the present output voltage of the switching power supply can be determined to be greater than the predetermined output voltage. If the detection voltage can be equal to the initial voltage of detection capacitor C, the present output voltage of the switching power supply can be determined to be equal to the predetermined output voltage. If the detection voltage can be less than the initial voltage of detection capacitor C, the present output voltage of the switching power supply can be determined to be less than the predetermined output voltage.

Figure 11:
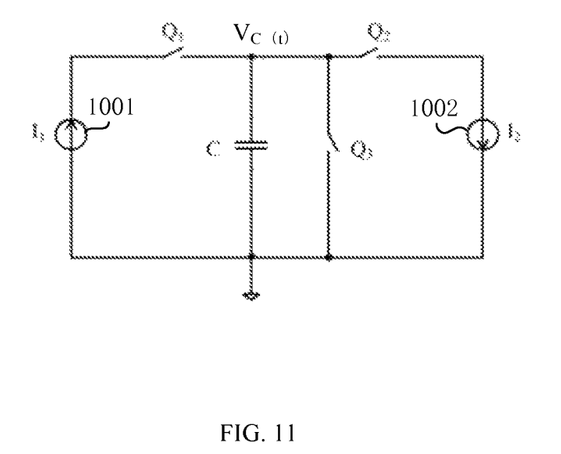
FIG. 11 is a schematic block diagram of a second example voltage detection circuit, in accordance with embodiments of the present invention.

Referring now to FIG. 11, shown is a schematic block diagram of a second example voltage detection circuit, in accordance with embodiments of the present invention. In this particular example, the voltage detection circuit can include switch $Q_3$ coupled in parallel with detection capacitor C. During time period $T_3$ of each switching cycle, both switches $Q_1$ and $Q_2$ are off, and switch $Q_3$ can be on to effectively short out detection capacitor C. In this way, detection capacitor C can be discharged via switch $Q_3$ such that the voltage of detection capacitor C is reset before the next switching cycle. For example, time period $T_3$ can be the time portion from the end time of time period $T_2$ to the start time of time period $T_1$ of a next switching cycle.

As shown in FIG. 9, time period $T_3$ can be a resonant time period in which the inductor current resonates around zero after reaching zero, and until being stable at zero in each switching cycle. When one terminal of detection capacitor C (the terminal not connected to switches $Q_1$ and $Q_2$) may not effectively be grounded, the voltage across detection capacitor C can be discharged via switch $Q_3$ during time period $T_3$, and the voltage can be reset to a predetermined reset voltage as the initial voltage of detection capacitor C.

In this case when detection capacitor C is discharged via switch $Q_3$ during time period $T_3$, and the voltage is reset to zero as the initial voltage of detection capacitor C, if initial voltage $V_{c(0)}$ of detection capacitor C is zero, when $V_{c(T1+T2)} > 0$, the present output voltage $V_o$ can be detected as greater than the predetermined output voltage of the switching power supply. When $V_{c(T1+T2)} = 0$, present output voltage $V_o$ can be detected as equal to the predetermined output voltage of the switching power supply, and when $V_{c(T1+T2)} < 0$, present output voltage $V_o$ can be detected as less than the predetermined output voltage of the switching power supply;

Therefore, as the voltage across the detection capacitor is reset during time period $T_3$, the initial voltage in any switching cycle can be the reset voltage for higher detection accuracy and stability of the switching power supply. Example waveforms of gate voltage $V_G$ of the power switch, inductor current $I_L$ of the inductor, and excitation voltage $V_L$ of the inductor of the switching power supply in one switching cycle, as well as the distribution of time periods $T_1$, $T_2$, and $T_3$, can be as shown in FIG. 9.

Referring now to FIG. 12, shown is a schematic block diagram of an example buck switching power supply with a voltage detection circuit, in accordance with embodiments of the present invention. This example buck switching power supply can include control circuit 1201 with the voltage detection circuits as described herein. The power stage circuit can include a buck converter topology, or any other suitable topology (e.g., boost, buck-boost, flyback, SEPIC, Zeta, etc.). For example, the control circuit can determine the state of the output voltage according to the detection voltage, and may adaptively regulate the output voltage of the switching power supply by way of the power stage circuit, according to this detected state.

The embodiments were chosen and described in order to best explain the principles of the invention and its practical applications, to thereby enable others skilled in the art to best utilize the invention and various embodiments with modifications as are suited to the particular use contemplated. It is intended that the scope of the invention be defined by the claims appended hereto and their equivalents.

What is claimed is:

1. A method of detecting a voltage, the method comprising:
   a) generating a first current according to a first voltage and a converting resistor;
   b) charging a detection capacitor by said first current during a first time period of a switching cycle of a switching power supply, wherein said first voltage comprises an excitation voltage on an inductor of said switching power supply during said first time period;
   c) charging said detection capacitor by a second current during a second time period of said switching cycle, wherein said first and second currents flow in opposite directions;
   d) detecting a voltage across said detection capacitor to obtain a detection voltage at an end time of said second time period, wherein said first time period comprises a rising portion of a current flowing through said inductor, and said second time period comprises a decreasing portion of said inductor current; and
   e) determining a state of a present output voltage of said switching power supply according to said detection voltage, wherein said converting resistor comprises a proportion of a predetermined output voltage of said switching power supply and said second current;
   wherein:
   a) said present output voltage of said switching power supply is determined to be greater than said predetermined output voltage when said detection voltage is greater than an initial voltage of said detection capacitor at a beginning of said switching cycle;
   b) said present output voltage of said switching power supply is determined to be equal to said predetermined output voltage when said detection voltage is equal to said initial voltage of detection capacitor; and
   c) said present output voltage of said switching power supply is determined to be less than said predetermined output voltage when said detection voltage is less than said initial voltage of detection capacitor.

2. The method of claim 1, further comprising resetting said voltage across said detection capacitor during a third time period, wherein said third time period comprises a time portion from said end time of said second time period to a start time of a next switching cycle.

3. The method of claim 2, wherein said third time period comprises a resonant time period in which said inductor current resonates after reaching zero until stable at zero in said switching cycle.

4. The method of claim 1, wherein said second current comprises an output current of a current source.

5. A voltage detection circuit, comprising:
   a) a first current generating circuit configured to generate a first current according to a first voltage and a converting resistor, wherein said first voltage comprises an excitation voltage on an inductor of a switching power supply during a first time period of a switching cycle of said switching power supply, and wherein said first time period comprises a rising portion of a current flowing through said inductor;
   b) a second current source configured to output a second current, wherein said first and second currents flow in opposite directions;
   c) a first switch coupled between said first current generating circuit and a detection capacitor;
   d) a second switch coupled between said second current source and said detection capacitor, wherein said first switch is on and said second switch is off such that said first current charges said detection capacitor via said first switch during said first time period, and wherein said first switch is off and said second switch is on such that said second current discharges said detection capacitor via said second switch during a second time period of said switching cycle; and
   e) wherein a voltage across said detection capacitor is detected to obtain a detection voltage at an end time of said second time period, said detection voltage being used to determine a state of a present output voltage of said switching power supply, wherein said second time period comprises a decreasing portion of said inductor current, and wherein said converting resistor comprises a proportion of a predetermined output voltage of said switching power supply and said second current;
   the voltage detection circuit further comprising a comparison circuit configured to compare said detection voltage against an initial voltage of said detection capacitor, wherein:
   a) said present output voltage of said switching power supply is determined to be greater than said predetermined output voltage when said detection voltage is greater than an initial voltage of said detection capacitor at a beginning of said switching cycle;
   b) said present output voltage of said switching power supply is determined to be equal to said predetermined output voltage when said detection voltage is equal to said initial voltage of detection capacitor; and
   c) said present output voltage of said switching power supply is determined to be less than said predetermined output voltage when said detection voltage is less than said initial voltage of detection capacitor.

6. The voltage detection circuit of claim 5, further comprising a third switch coupled in parallel to said detection capacitor, wherein:
   a) said first and second switches are off and said third switch is on such that said detection capacitor is discharged via said third switch to reset said voltage across said detection capacitor during a third time period of said switching cycle;
   b) said third time period comprises a time portion from said end time of said second time period to a start time of a next switching cycle.

7. The voltage detection circuit of claim 6, wherein said third time period comprises a resonant time period in which said inductor current resonates after reaching zero until stable at zero in said switching cycle.

8. A switching power supply, comprising:
   a) the voltage detection circuit of claim 5;
   b) a control circuit coupled to the voltage detection circuit; and
   c) a power stage circuit coupled to the control circuit.

9. The switching power supply of claim 8, wherein said power stage circuit comprises a buck converter topology.

* * * * *